United States Patent
Zhang et al.

(10) Patent No.: US 12,235,624 B2
(45) Date of Patent: Feb. 25, 2025

(54) METHODS AND MECHANISMS FOR ADJUSTING PROCESS CHAMBER PARAMETERS DURING SUBSTRATE MANUFACTURING

(71) Applicant: APPLIED MATERIALS, INC., Santa Clara, CA (US)

(72) Inventors: Chunlei Zhang, Santa Clara, CA (US); Tao Zhang, San Ramon, CA (US); Jairaj Payyapilly, San Bruno, CA (US)

(73) Assignee: Applied Materials, Inc., Santa Clara, CA (US)

( * ) Notice: Subject to any disclaimer, the term of this patent is extended or adjusted under 35 U.S.C. 154(b) by 25 days.

(21) Appl. No.: 17/557,816

(22) Filed: Dec. 21, 2021

(65) Prior Publication Data

US 2023/0195078 A1 Jun. 22, 2023

(51) Int. Cl.
G05B 19/4155 (2006.01)
(52) U.S. Cl.
CPC .......... *G05B 19/4155* (2013.01); *G05B 2219/45212* (2013.01)
(58) Field of Classification Search
None
See application file for complete search history.

(56) References Cited

U.S. PATENT DOCUMENTS

| | | | |
|---|---|---|---|
| 5,238,354 A | 8/1993 | Volovich | |
| 5,427,878 A | 6/1995 | Corliss | |
| 5,452,521 A | 9/1995 | Niewmierzycki | |
| 6,162,008 A | 12/2000 | Perkins et al. | |
| 6,304,999 B1 | 10/2001 | Toprac et al. | |
| 6,625,497 B2 | 9/2003 | Fairbairn et al. | |
| 6,708,075 B2 | 3/2004 | Sonderman et al. | |

(Continued)

FOREIGN PATENT DOCUMENTS

| | | |
|---|---|---|
| CN | 305860013 | 6/2020 |
| CN | 306604020 | 6/2021 |

(Continued)

OTHER PUBLICATIONS

"Production-centric Yield Management for Wafer Manufacturing" Jan. 5, 2018, Synopisis, site visited Jan. 6, 2022: https://www.synopsys.com/content/dam/synopsys/silicon/datasheets/odyssey-ds.pdf (Year: 2018).

(Continued)

*Primary Examiner* — Ryan A Jarrett
(74) *Attorney, Agent, or Firm* — Lowenstein Sandler LLP

(57) ABSTRACT

An electronic device manufacturing system capable of obtaining metrology data generated using metrology equipment located within a process chamber that performs a deposition process on a substrate according to a process recipe, wherein the process recipe comprises a plurality of setting parameters, and wherein the deposition process generates a plurality of film layers on a surface of the substrate. The manufacturing system can further generate a correction profile based on the metrology data. The manufacturing system can further generate an updated process recipe by applying the correction profile to the process recipe. The manufacturing system can further cause an etch process to be performed on the substrate according to the updated process recipe.

23 Claims, 8 Drawing Sheets

(56) References Cited

U.S. PATENT DOCUMENTS

| | | | |
|---|---|---|---|
| 6,728,591 | B1 | 4/2004 | Hussey, Jr. et al. |
| 7,199,416 | B1 * | 4/2007 | Tripsas ............... H01L 27/1021 |
| | | | 257/E27.095 |
| D605,652 | S | 12/2009 | Plaisted et al. |
| 7,642,102 | B2 | 1/2010 | Funk et al. |
| D618,695 | S | 6/2010 | Bennett et al. |
| 7,904,275 | B2 | 3/2011 | Sugimoto |
| 8,072,578 | B2 | 12/2011 | Yasuda et al. |
| 8,179,530 | B2 | 5/2012 | Levy et al. |
| 8,257,546 | B2 | 9/2012 | Davis et al. |
| D756,371 | S | 5/2016 | Bertnick et al. |
| 9,347,879 | B2 | 5/2016 | Adel et al. |
| D766,940 | S | 9/2016 | Napper et al. |
| D767,612 | S | 9/2016 | Hemsley |
| D781,300 | S | 3/2017 | Rhodes et al. |
| 9,738,977 | B1 * | 8/2017 | Karim ................. H01L 21/0217 |
| D819,066 | S | 5/2018 | Anderson et al. |
| D829,749 | S | 10/2018 | Kang et al. |
| 10,262,910 | B2 | 4/2019 | Feng et al. |
| 10,388,549 | B2 | 8/2019 | Paul et al. |
| 10,490,462 | B2 | 11/2019 | Pandev et al. |
| D874,481 | S | 2/2020 | Kumar et al. |
| D884,015 | S | 5/2020 | Walfridsson et al. |
| D890,799 | S | 7/2020 | Heffernan et al. |
| 10,727,057 | B2 | 7/2020 | Clark et al. |
| 10,727,142 | B2 | 7/2020 | Gellineau et al. |
| D892,143 | S | 8/2020 | Dascola et al. |
| 10,886,155 | B2 | 1/2021 | Zhu et al. |
| D914,703 | S | 3/2021 | Capela et al. |
| 11,029,673 | B2 | 6/2021 | Honda et al. |
| D928,818 | S | 8/2021 | Yuk et al. |
| D937,861 | S | 12/2021 | Torrance |
| D938,465 | S | 12/2021 | Shen et al. |
| D940,169 | S | 1/2022 | Boutros et al. |
| D941,851 | S | 1/2022 | Anderson et al. |
| D948,543 | S | 4/2022 | Friedland et al. |
| 2002/0018217 | A1 | 2/2002 | Weber-Grabau et al. |
| 2003/0020889 | A1 | 1/2003 | Takahashi |
| 2005/0032250 | A1 * | 2/2005 | Mui ........................ H01L 22/20 |
| | | | 257/E21.232 |
| 2005/0041255 | A1 | 2/2005 | Hyun et al. |
| 2005/0187649 | A1 | 8/2005 | Funk et al. |
| 2007/0134829 | A1 | 6/2007 | Wilke et al. |
| 2008/0013089 | A1 | 1/2008 | Ishii et al. |
| 2009/0000950 | A1 * | 1/2009 | Ortleb ..................... H01L 22/12 |
| | | | 204/298.03 |
| 2009/0132078 | A1 | 5/2009 | Sakano |
| 2009/0280579 | A1 * | 11/2009 | Pal .................... H01L 29/66636 |
| | | | 257/E21.53 |
| 2010/0332011 | A1 | 12/2010 | Venugopal et al. |
| 2011/0172952 | A1 | 7/2011 | Ummethala et al. |
| 2011/0232569 | A1 | 9/2011 | Olgado |
| 2012/0285621 | A1 | 11/2012 | Tan |
| 2013/0059403 | A1 | 3/2013 | Lee et al. |
| 2015/0004721 | A1 | 1/2015 | Akimoto et al. |
| 2016/0077025 | A1 | 3/2016 | Zhang et al. |
| 2016/0313658 | A1 | 10/2016 | Marciano et al. |
| 2016/0341544 | A1 | 11/2016 | Foad |
| 2017/0038201 | A1 | 2/2017 | Bozdog et al. |
| 2017/0213750 | A1 | 7/2017 | Khaja et al. |
| 2018/0150052 | A1 | 5/2018 | Cherian |
| 2019/0064751 | A1 | 2/2019 | Ohmori et al. |
| 2019/0073566 | A1 | 3/2019 | Brauer |
| 2019/0121928 | A1 | 4/2019 | Wu et al. |
| 2019/0147127 | A1 | 5/2019 | Su et al. |
| 2019/0286075 | A1 | 9/2019 | Yennie et al. |
| 2019/0347527 | A1 | 11/2019 | Bhaviripudi et al. |
| 2020/0050180 | A1 | 2/2020 | Kou et al. |
| 2020/0083070 | A1 | 3/2020 | Clark et al. |
| 2020/0083080 | A1 | 3/2020 | Clark et al. |
| 2020/0110341 | A1 | 4/2020 | Mossavat et al. |
| 2020/0110390 | A1 | 4/2020 | Banna |
| 2020/0243359 | A1 | 7/2020 | Hao et al. |
| 2021/0166121 | A1 | 6/2021 | Tsutsui |
| 2021/0354265 | A1 | 11/2021 | Xu et al. |
| 2022/0026817 | A1 | 1/2022 | Ummethala et al. |
| 2022/0028716 | A1 | 1/2022 | Ummethala et al. |
| 2022/0066411 | A1 | 3/2022 | Ummethala et al. |
| 2022/0111529 | A1 | 4/2022 | Pehlivan et al. |
| 2022/0165593 | A1 | 5/2022 | Panda et al. |

FOREIGN PATENT DOCUMENTS

| | | | |
|---|---|---|---|
| JP | 2018037559 | A | 3/2018 |
| JP | D1644619 | S | 11/2019 |
| JP | 2020004817 | A | 1/2020 |
| JP | D1651220 | S | 1/2020 |
| JP | D1659894 | S | 5/2020 |
| JP | D1664109 | S | 7/2020 |
| KR | 101910268 | B1 | 10/2018 |
| KR | 10-2019-0060524 | A1 | 6/2019 |
| WO | 0229393 | A2 | 4/2002 |
| WO | 2012099907 | | 7/2012 |
| WO | 2019200015 | | 10/2019 |
| WO | 2020094325 | A1 | 5/2020 |
| WO | 2020/167944 | A1 | 8/2020 |
| WO | 2021021501 | A1 | 2/2021 |
| WO | 2021061541 | A1 | 4/2021 |
| WO | 2021067239 | A1 | 4/2021 |

OTHER PUBLICATIONS

Ronald L. Allen et al., "Application of neural networks to plasma etch end point detection", Journal of Vacuum Science & Technology B: Microelectronics and Nanometer Structures Processing, Measurement, and Phenomena 14, 498 (1996), pp. 498-503.

PCT International Search Report and Written Opinion for International Application No. PCT/US2021/042646 mailed Nov. 2, 2021, 10 pages.

PCT International Search Report and Written Opinion for International Application No. PCT/US2021/042639 mailed Nov. 11, 2021, 10 pages.

PCT International Search Report and Written Opinion for International Application No. PCT/US2021/042643 mailed Nov. 11, 2021, 9 pages.

PCT International Search Report and Written Opinion for International Application No. PCT/US2021/048061 mailed Dec. 17, 2021, 9 pages.

Taiwan Search report of Taiwan Application No. 110300382 dated Sep. 27, 2021, 7 pages.

PCT International Search Report and Written Opinion for International Application No. PCT/US2022/051288 mailed Apr. 4, 2023, 10 pages.

* cited by examiner

METHODS AND MECHANISMS FOR ADJUSTING PROCESS CHAMBER PARAMETERS DURING SUBSTRATE MANUFACTURING

TECHNICAL FIELD

The present disclosure relates to electrical components, and, more particularly, to methods and mechanisms for adjusting process chamber parameters during substrate manufacturing.

BACKGROUND

Products can be produced by performing one or more manufacturing processes using manufacturing equipment. For example, semiconductor manufacturing equipment can be used to produce semiconductor devices (e.g., substrates) via semiconductor manufacturing processes. The manufacturing equipment can, according to a process recipe, deposit multiple layers of film on the surface of the substrate and can perform an etch process to form the intricate pattern in the deposited film. For example, the manufacturing equipment can perform a chemical vapor deposition (CVD) process to deposit alternative layers on the substrate. Sensors can be used to determine manufacturing parameters of the manufacturing equipment during the manufacturing processes and metrology equipment can be used to determine property data of the products that were produced by the manufacturing equipment, such as the overall thickness of the layers on the substrate. Generally, the manufacturing equipment can monitor individual sensors to detect a problem during the deposition process. However, monitoring individual sensors does not provide correction data during the manufacturing process, which can lead to inferior or unusable products. Therefore, a system capable of generating correction data during the manufacturing process is desirable.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, an electronic device manufacturing system includes a transfer chamber, a process chamber coupled to the transfer chamber, and metrology equipment situated within at least one of the transfer chamber or the process chamber. The manufacturing system is configured to obtain metrology data generated using metrology equipment located within the process chamber that performs a deposition process on a substrate according to a process recipe, wherein the process recipe comprises a plurality of setting parameters, and wherein the deposition process generates a plurality of film layers on a surface of the substrate. The manufacturing system can further generate a correction profile based on the metrology data. The manufacturing system can further generate an updated process recipe by applying the correction profile to the process recipe. The manufacturing system can further cause an etch process to be performed on the substrate according to the updated process recipe.

A further aspect of the disclosure includes a method according to any aspect or embodiment described herein.

A further aspect of the disclosure includes a non-transitory computer-readable storage medium comprising instructions that, when executed by a processing device operatively coupled to a memory, performs operations according to any aspect or embodiment described herein.

BRIEF DESCRIPTION OF THE DRAWINGS

The present disclosure is illustrated by way of example, and not by way of limitation in the figures of the accompanying drawings.

DETAILED DESCRIPTION

Figure 1:
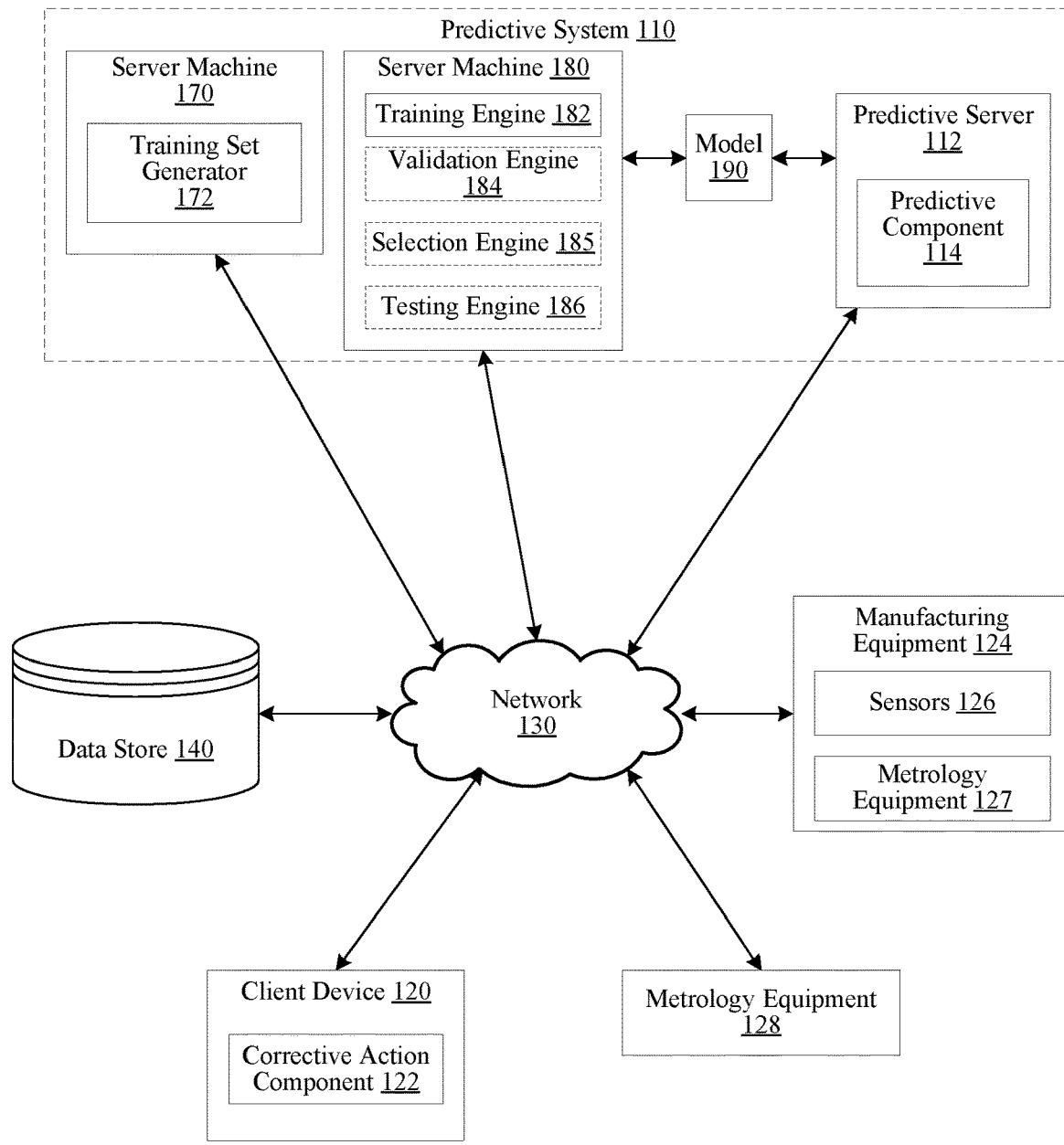
FIG. 1 is a block diagram illustrating an example system architecture, according to certain embodiments.

Described herein are technologies directed to methods and mechanisms for adjusting process chamber parameters during substrate manufacturing. A film can be deposited on a surface of a substrate during a deposition process (e.g., a deposition (CVD) process, an atomic layer deposition (ALD) process, and so forth) performed at a process chamber of a manufacturing system. For example, in a CVD process, the substrate is exposed to one or more precursors, which react on the substrate surface to produce the desired deposit. The film can include one or more layers of materials that are formed during the deposition process, and each layer can include a particular thickness gradient (e.g., changes in the thickness along a layer of the deposited film). For example, a first layer can be formed directly on the surface of the substrate (referred to as a proximal layer or proximal end of the film) and have a first thickness. After the first layer is formed on the surface of the substrate, a second layer having a second thickness can be formed on the first layer. This process continues until the deposition process is completed and a final layer is formed for the film (referred to as the distal layer or distal end of the film). The film can include alternating layers of different materials. For example, the film can include alternating layers of oxide and nitride layers (oxide-nitride-oxide-nitride stack or ONON stack), alternating oxide and polysilicon layers (oxide-polysilicon-oxide-polysilicon stack or OPOP stack), and so forth.

The film can be subjected to, for example, an etch process to form a pattern on the surface of the substrate, a chemical-mechanical polishing (CMP) process to smooth the surface of the film, or any other process necessary to manufacture the finished substrate. An etch process can include exposing highly energetic process gas (e.g., a plasma) with a sample surface to break down the materials at the surface, which can then be removed by a vacuum system.

A process chamber can perform each substrate manufacturing process (e.g., the deposition process, the etch process, the polishing process, etc.) according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc. Accordingly, the thickness of each film layer can be correlated to these process chamber settings.

During the substrate manufacturing process, the process chamber can experience deteriorating conditions, such as a build-up of contaminant, erosion on certain components, etc. These deteriorating conditions can cause defects in the substrates (e.g., actual layer thickness deviating from expected layer thickness, uneven layer thickness, incomplete etching, etc.). For example, uneven layer thickness can cause the gas distribution plate to be nearer or farther from the surface of the substrate, thus affecting the plasma flow and/or temperature during the subsequent etching process. This can lead to inferior products, reduced manufacturing yield, and significant downtime and repair time. In another example, during the start of a production run (e.g., processing a batch of substrates), the first substrate can be processed and used to calibrate a process chamber. In particular, once the first substrate is processed, the metrology data can be extracted from the substrate and, based on the metrology data, a technician can manually adjust the settings for the rest of the batch. However, this is a time consuming and error prone process, which can cause a delay in achieving optimal process chamber settings (e.g., pressure and flow rate of a process gas, temperature, etc.), thus causing delays in manufacturing and/or deformations in the film.

Aspects and implementations of the present disclosure address these and other shortcomings of the existing technology by generating correction profiles based on data generated by metrology equipment located within the process chamber. In particular, metrology equipment can be included inside of or coupled to a process chamber (referred to as "in-situ metrology equipment). The in-situ metrology equipment can be configured to generate metrology data for a substrate before, during, and/or after a manufacturing process (e.g., a deposition process, an etch process, etc.) while the substrate remains in the process chamber. In some embodiments, the in-situ metrology equipment can include optical equipment (e.g., an IR camera) to measure the dimensions (e.g., thickness, height, etc.) of the film or etch on a substrate. For example, the in-situ metrology equipment can use the optical equipment to obtain dimension data for approximately 3,000 locations along the entire substrate. In another example, the in-situ metrology equipment can use the optical equipment to obtain dimension data only along the edge of the substrate, which can be used for improving an etching process along the edge of the deposited film. The in-situ metrology equipment can use the metrology data to generate a thickness profile indicative of one or more thickness values across the surface of the substrate. The thickness profile can indicate the thickness of the film on the substrate, the depth of each etch on the substrate, etc.

The in-situ metrology equipment can generate the thickness profiles at different times during the manufacturing process. For example, a first step of a process recipe can be performed on the substrate and the in-situ metrology equipment can then generate a first thickness profile of the substrate. Next, a second step of the process recipe can be performed on the substrate and the in-situ metrology equipment can then generate a second thickness profile of the substrate, and so forth.

The thickness profiles can be used by the manufacturing system to generate a correction profile. The correction profile can include one or more adjustments or offsets (e.g., corrective actions) to be applied to the parameters of the process recipe or the process chamber. For example, the correction profile can include an adjustment to the temperature setting for the process chamber, the pressure setting for the process chamber, the flow rate setting for a precursor for a material included in the film deposited on the substrate surface, to the power supplied to the process chamber, to the ratio of two or more settings, etc. The manufacturing system can generate the correction profiles by determining a difference between an expected profile (e.g., the thickness profile expected to be generated by the process recipe) and the generated thickness profile. For example, the manufacturing system can generate the correction profile by applying an algorithm to the difference and/or looking up the difference in a library of known faults where each difference is associated with a correction profile. The correction profile(s) can be applied to one or more steps of the deposition process, the etch process, etc. In some embodiments, the each correction profile can be applied to subsequent steps of the process recipe upon completion of a current process step. This allows the manufacturing equipment to compensate for deviations that already occurred during manufacturing of the current substrate. In other embodiments, for subsequent substrates, each correction profile can be applied to the process step associated with the metrology data used to generate said correction profile. This allows the manufacturing system to generate adjustments for the manufacturing of subsequent substrates.

In some embodiments, the manufacturing system can perform a chamber matching operation, on a second process chamber, based on the correction profile. Chamber matching can be used to minimize process variation between substrates due to hardware variations. For example, the hardware variations can include different chuck temperatures, different lid temperatures, differences in the power delivery to each process chamber, differences in gas flow and/or pressure, etc. The chamber matching operation can include adjusting one or more parameters of the second process chamber or adjusting one or more parameters of a recipe used to generate a substrate in the second process chamber.

In some embodiments, a predictive system can train and apply a machine-learning model to current sensor values associated with a thickness profile to generate an output, such as, one or more values indicative of correction to one or more parameters of the process recipe. In some embodiments, the output is a value indicative of a difference between the expected thickness profile of the film on the substrate and the actual thickness profile of the film on the substrate. In some embodiments, the system can then compare the difference (between the expected thickness profile and the actual thickness profile) to a library of known fault (e.g., deviation) patterns to determine a correction profile. In some embodiments, the system performs a corrective action to adjust, based on the correction pattern, one or more parameters of a deposition process recipe (e.g., a temperature setting for the process chamber, a pressure setting for the process chamber, a flow rate setting for a precursor for a material included in the film deposited on the substrate surface, etc.), one or more parameters of an etch process, or one or more parameters of any other manufacturing process.

Aspects of the present disclosure result in technological advantages of significant reduction in time that it takes to perform an optimization of the parameters of a process recipe. The disclosed configuration allows for the system to characterize the process chamber periodically, such as during each step of a process recipe. Aspects of the present disclosure further result in technological advantages of significant reduction in time to detect issues or failures experienced by a substrate during the manufacturing process, as well as improvements in energy consumption, and so forth. The present disclosure can also result in generating diagnostic data and performing corrective actions to avoid inconsistent and abnormal products, and unscheduled user time or down time.

FIG. 1 depicts an illustrative computer system architecture 100, according to aspects of the present disclosure. In some embodiments, computer system architecture 100 can be included as part of a manufacturing system for processing substrates, such as manufacturing system 300 of FIG. 3. Computer system architecture 100 includes a client device 120, manufacturing equipment 124, metrology equipment 128, a predictive server 112 (e.g., to generate predictive data, to provide model adaptation, to use a knowledge base, etc.), and a data store 140. The predictive server 112 can be part of a predictive system 110. The predictive system 110 can further include server machines 170 and 180. The manufacturing equipment 124 can include sensors 126 configured to capture data for a substrate being processed at the manufacturing system. In some embodiments, the manufacturing equipment 124 and sensors 126 can be part of a sensor system that includes a sensor server (e.g., field service server (FSS) at a manufacturing facility) and sensor identifier reader (e.g., front opening unified pod (FOUP) radio frequency identification (RFID) reader for sensor system). In some embodiments, metrology equipment 128 can be part of a metrology system that includes a metrology server (e.g., a metrology database, metrology folders, etc.) and metrology identifier reader (e.g., FOUP RFID reader for metrology system).

Manufacturing equipment 124 can produce products, such as electronic devices, following a recipe or performing runs over a period of time. Manufacturing equipment 124 can include a process chamber, such as process chamber 400 described with respect to FIG. 4. Manufacturing equipment 124 can perform a process for a substrate (e.g., a wafer, etc.) at the process chamber. Examples of substrate processes include a deposition process to deposit one or more layers of film on a surface of the substrate, an etch process to form a pattern on the surface of the substrate, etc. Manufacturing equipment 124 can perform each process according to a process recipe. A process recipe defines a particular set of operations to be performed for the substrate during the process and can include one or more settings associated with each operation. For example, a deposition process recipe can include a temperature setting for the process chamber, a pressure setting for the process chamber, a flow rate setting for a precursor for a material included in the film deposited on the substrate surface, etc.

In some embodiments, manufacturing equipment 124 includes sensors 126 that are configured to generate data associated with a substrate processed at manufacturing system 100. For example, a process chamber can include one or more sensors configured to generate spectral or non-spectral data associated with the substrate before, during, and/or after a process (e.g., a deposition process) is performed for the substrate. In some embodiments, spectral data generated by sensors 126 can indicate a concentration of one or more materials deposited on a surface of a substrate. Sensors 126 configured to generate spectral data associated with a substrate can include reflectometry sensors, ellipsometry sensors, thermal spectra sensors, capacitive sensors, and so forth. Sensors 126 configured to generate non-spectral data associated with a substrate can include temperature sensors, pressure sensors, flow rate sensors, voltage sensors, etc. Further details regarding manufacturing equipment 124 are provided with respect to FIG. 3 and FIG. 4.

In some embodiments, sensors 126 provide sensor data (e.g., sensor values, features, trace data) associated with manufacturing equipment 124 (e.g., associated with producing, by manufacturing equipment 124, corresponding products, such as wafers). The manufacturing equipment 124 can produce products following a recipe or by performing runs over a period of time. Sensor data received over a period of time (e.g., corresponding to at least part of a recipe or run) can be referred to as trace data (e.g., historical trace data, current trace data, etc.) received from different sensors 126 over time. Sensor data can include a value of one or more of temperature (e.g., heater temperature), spacing (SP), pressure, high frequency radio frequency (HFRF), voltage of electrostatic chuck (ESC), electrical current, material flow, power, voltage, etc. Sensor data can be associated with or indicative of manufacturing parameters such as hardware parameters, such as settings or components (e.g., size, type, etc.) of the manufacturing equipment 124, or process parameters of the manufacturing equipment 124. The sensor data can be provided while the manufacturing equipment 124 is performing manufacturing processes (e.g., equipment readings when processing products). The sensor data can be different for each substrate.

Metrology equipment 127, 128 can provide metrology data associated with substrates processed by manufacturing equipment 124. The metrology data can include a value of film property data (e.g., wafer spatial film properties), dimensions (e.g., thickness, height, etc.), dielectric constant, dopant concentration, density, defects, etc. In some embodiments, the metrology data can further include a value of one or more surface profile property data (e.g., an etch rate, an etch rate uniformity, a critical dimension of one or more features included on a surface of the substrate, a critical dimension uniformity across the surface of the substrate, an edge placement error, etc.). The metrology data can be of a finished or semi-finished product. The metrology data can be different for each substrate. Metrology data can be generated using, for example, reflectometry techniques, ellipsometry techniques, TEM techniques, and so forth.

Metrology equipment 127 can be included as part of the manufacturing equipment 124. For example, metrology equipment 127 can be included inside of or coupled to a process chamber and configured to generate metrology data for a substrate before, during, and/or after a process (e.g., a deposition process, an etch process, etc.) while the substrate remains in the process chamber. In some instances, metrology equipment 127 can be referred to as in-situ metrology equipment. In another example, metrology equipment 127 can be coupled to another station of manufacturing equipment 124. For example, metrology equipment can be coupled to a transfer chamber, such as transfer chamber 310 of FIG. 3, a load lock, such as load lock 320, or a factory interface, such as factory interface 306.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc. In some embodiments, the metrology data can be received from the client device 120. Client device 120 can display a graphical user interface (GUI), where the GUI enables the user to provide, as input, metrology measurement values for substrates processed at the manufacturing system. The client device 120 can include a corrective action component 122. Corrective action component 122 can receive user input (e.g., via a Graphical User Interface (GUI) displayed via the client device 120) of an indication associated with manufacturing equipment 124. In some embodiments, the corrective action component 122 transmits the indication to the predictive system 110, receives output (e.g., predictive data) from the predictive system 110, determines a corrective action based on the output, and causes the corrective action to be implemented. In some embodiments, the corrective action component 122 receives an indication of a corrective action from the predictive system 110 and causes the corrective action to be implemented. Each client device 120 can include an operating system that allows users to one or more of generate, view, or edit data (e.g., indication associated with manufacturing equipment 124, corrective actions associated with manufacturing equipment 124, etc.).

Data store 140 can be a memory (e.g., random access memory), a drive (e.g., a hard drive, a flash drive), a database system, or another type of component or device capable of storing data. Data store 140 can include multiple storage components (e.g., multiple drives or multiple databases) that can span multiple computing devices (e.g., multiple server computers). The data store 140 can store data associated with processing a substrate at manufacturing equipment 124. For example, data store 140 can store data collected by sensors 126 at manufacturing equipment 124 before, during, or after a substrate process (referred to as process data). Process data can refer to historical process data (e.g., process data generated for a prior substrate processed at the manufacturing system) and/or current process data (e.g., process data generated for a current substrate processed at the manufacturing system). Data store can also store spectral data or non-spectral data associated with a portion of a substrate processed at manufacturing equipment 124. Spectral data can include historical spectral data and/or current spectral data.

The data store 140 can also store contextual data associated with one or more substrates processed at the manufacturing system. Contextual data can include a recipe name, recipe step number, preventive maintenance indicator, operator, etc. Contextual data can refer to historical contextual data (e.g., contextual data associated with a prior process performed for a prior substrate) and/or current process data (e.g., contextual data associated with current process or a future process to be performed for a prior substrate). The contextual data can further include identify sensors that are associated with a particular sub-system of a process chamber.

The data store 140 can also store task data. Task data can include one or more sets of operations to be performed for the substrate during a deposition process and can include one or more settings associated with each operation. For example, task data for a deposition process can include a temperature setting for a process chamber, a pressure setting for a process chamber, a flow rate setting for a precursor for a material of a film deposited on a substrate, etc. In another example, task data can include controlling pressure at a defined pressure point for the flow value. Task data can refer to historical task data (e.g., task data associated with a prior process performed for a prior substrate) and/or current task data (e.g., task data associated with current process or a future process to be performed for a substrate).

In some embodiments, data store 140 can store expected profiles, thickness profiles, and corrections profiles. An expected profile can include one or more data points associated with a desired film profile expected to be produced by a certain process recipe. In some embodiments, an expected profile can include the desired thickness of the film. The thickness profile include one or more data points associated with a current film profile generated by the manufacturing equipment 124. The thickness profile can be measured using metrology equipment 127, 128. The correction profile can include one or more adjustments or offsets to be applied to the parameters of the process chamber or the process recipe. For example, the correction profile can include an adjustment to the temperature setting for the process chamber, the pressure setting for the process chamber, the flow rate setting for a precursor for a material included in the film deposited on the substrate surface, to the power supplied to the process chamber, to the ratio of two or more settings, etc. The correction profiles can be generated by comparing the expected profile (e.g., the thickness profile expected to be generated by the process recipe), and determining, using a library of known fault patterns and/or an algorithm, the adjustment to be applied to the parameters of the process recipe to achieve the expected profile. The correction profiles can be applied to steps associated with the deposition process, the etch process, etc.

In some embodiments, data store 140 can be configured to store data that is not accessible to a user of the manufacturing system. For example, process data, spectral data, contextual data, etc. obtained for a substrate being processed at the manufacturing system is not accessible to a user (e.g., an operator) of the manufacturing system. In some embodiments, all data stored at data store 140 can be inaccessible by the user of the manufacturing system. In other or similar embodiments, a portion of data stored at data store 140 can be inaccessible by the user while another portion of data stored at data store 140 can be accessible by the user. In some embodiments, one or more portions of data stored at data store 140 can be encrypted using an encryption mechanism that is unknown to the user (e.g., data is encrypted using a private encryption key). In other or similar embodiments, data store 140 can include multiple data stores where data that is inaccessible to the user is stored in one or more first data stores and data that is accessible to the user is stored in one or more second data stores.

In some embodiments, data store 140 can be configured to store data associated with known fault patterns. A fault pattern can be a one or more values (e.g., a vector, a scalar, etc.) associated with one or more issues or failures associated with a process chamber sub-system. In some embodiments, a fault pattern can be associated with a corrective action. For example, a fault pattern can include parameter adjustment steps to correct the issue or failure indicated by the fault pattern. For example, the predictive system can compare a determined fault pattern to a library of known fault patterns to determine the type of failure experienced by a sub-system, the cause of the failure, the recommended corrective action to correct the fault, and so forth.

In some embodiments, predictive system 110 includes predictive server 112, server machine 170 and server machine 180. The predictive server 112, server machine 170, and server machine 180 can each include one or more computing devices such as a rackmount server, a router computer, a server computer, a personal computer, a mainframe computer, a laptop computer, a tablet computer, a desktop computer, Graphics Processing Unit (GPU), accelerator Application-Specific Integrated Circuit (ASIC) (e.g., Tensor Processing Unit (TPU)), etc.

Server machine 170 includes a training set generator 172 that is capable of generating training data sets (e.g., a set of data inputs and a set of target outputs) to train, validate, and/or test a machine-learning model 190. Machine-learning model 190 can be any algorithmic model capable of learning from data. Some operations of data set generator 172 is described in detail below with respect to FIG. 2. In some embodiments, the data set generator 172 can partition the training data into a training set, a validating set, and a testing set. In some embodiments, the predictive system 110 generates multiple sets of training data.

Server machine 180 can include a training engine 182, a validation engine 184, a selection engine 185, and/or a testing engine 186. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training one or more machine-learning models 190. Machine-learning model 190 can refer to the model artifact that is created by the training engine 182 using the training data (also referred to herein as a training set) that includes training inputs and corresponding target outputs (correct answers for respective training inputs). The training engine 182 can find patterns in the training data that map the training input to the target output (the answer to be predicted), and provide the machine-learning model 190 that captures these patterns. The machine-learning model 190 can use one or more of a statistical modelling, support vector machine (SVM), Radial Basis Function (RBF), clustering, supervised machine-learning, semi-supervised machine-learning, unsupervised machine-learning, k-nearest neighbor algorithm (k-NN), linear regression, random forest, neural network (e.g., artificial neural network), etc.

One type of machine learning model that can be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities can be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks can learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. In a plasma process tuning, for example, the raw input can be process result profiles (e.g., thickness profiles indicative of one or more thickness values across a surface of a substrate); the second layer can compose feature data associated with a status of one or more zones of controlled elements of a plasma process system (e.g., orientation of zones, plasma exposure duration, etc.); the third layer can include a starting recipe (e.g., a recipe used as a starting point for determining an updated process recipe the process a substrate to generate a process result the meets threshold criteria). Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs can be that of the network and can be the number of hidden layers plus one. For recurrent neural networks, in which a signal can propagate through a layer more than once, the CAP depth is potentially unlimited.

In one embodiment, one or more machine learning model is a recurrent neural network (RNN). An RNN is a type of neural network that includes a memory to enable the neural network to capture temporal dependencies. An RNN is able to learn input-output mappings that depend on both a current input and past inputs. The RNN will address past and future flow rate measurements and make predictions based on this continuous metrology information. RNNs can be trained using a training dataset to generate a fixed number of outputs (e.g., to determine a set of substrate processing rates, determine modification to a substrate process recipe). One type of RNN that can be used is a long short term memory (LSTM) neural network.

Training of a neural network can be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

A training dataset containing hundreds, thousands, tens of thousands, hundreds of thousands or more sensor data and/or process result data (e.g., metrology data such as one or more thickness profiles associated with the sensor data) can be used to form a training dataset.

To effectuate training, processing logic can input the training dataset(s) into one or more untrained machine learning models. Prior to inputting a first input into a machine learning model, the machine learning model can be initialized. Processing logic trains the untrained machine learning model(s) based on the training dataset(s) to generate one or more trained machine learning models that perform various operations as set forth above. Training can be performed by inputting one or more of the sensor data into the machine learning model one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer can be another hidden layer or an output layer. In either case, the nodes at the next layer receive the output values from the nodes at the previous layer, and each node applies weights to those values and then generates its own output value. This can be performed at each layer. A final layer is the output layer, where there is one node for each class, prediction and/or output that the machine learning model can produce.

Accordingly, the output can include one or more predictions or inferences. For example, an output prediction or inference can include one or more predictions of film buildup on chamber components, erosion of chamber components, predicted failure of chamber components, and so on. Processing logic determines an error (i.e., a classification error) based on the differences between the output (e.g., predictions or inferences) of the machine learning model and target labels associated with the input training data. Processing logic adjusts weights of one or more nodes in the machine learning model based on the error. An error term or delta can be determined for each node in the artificial neural network. Based on this error, the artificial neural network adjusts one or more of its parameters for one or more of its nodes (the weights for one or more inputs of a node). Parameters can be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters can include adjusting the weights assigned to each of the inputs for one or more neurons at one or more layers in the artificial neural network.

After one or more rounds of training, processing logic can determine whether a stopping criterion has been met. A stopping criterion can be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy can be, for example, 70%, 80% or 90% accuracy. In one embodiment, the stopping criterion is met if accuracy of the machine learning model has stopped improving. If the stopping criterion has not been met, further training is performed. If the stopping criterion has been met, training can be complete. Once the machine learning model is trained, a reserved portion of the training dataset can be used to test the model.

Once one or more trained machine learning models 190 are generated, they can be stored in predictive server 112 as predictive component 114 or as a component of predictive component 114.

The validation engine 184 can be capable of validating machine-learning model 190 using a corresponding set of features of a validation set from training set generator 172. Once the model parameters have been optimized, model validation can be performed to determine whether the model has improved and to determine a current accuracy of the deep learning model. The validation engine 184 can determine an accuracy of machine-learning model 190 based on the corresponding sets of features of the validation set. The validation engine 184 can discard a trained machine-learning model 190 that has an accuracy that does not meet a threshold accuracy. In some embodiments, the selection engine 185 can be capable of selecting a trained machine-learning model 190 that has an accuracy that meets a threshold accuracy. In some embodiments, the selection engine 185 can be capable of selecting the trained machine-learning model 190 that has the highest accuracy of the trained machine-learning models 190.

The testing engine 186 can be capable of testing a trained machine-learning model 190 using a corresponding set of features of a testing set from data set generator 172. For example, a first trained machine-learning model 190 that was trained using a first set of features of the training set can be tested using the first set of features of the testing set. The testing engine 186 can determine a trained machine-learning model 190 that has the highest accuracy of all of the trained machine-learning models based on the testing sets.

As described in detail below, predictive server 112 includes a predictive component 114 that is capable of providing data indicative of the expected behavior of each sub-system of a process chamber, and running trained machine-learning model 190 on the current sensor data input to obtain one or more outputs. The predictive server 112 can further provide data indicative of the health of the process chamber sub-system and diagnostics. This will be explained in further detail below.

The client device 120, manufacturing equipment 124, sensors 126, metrology equipment 128, predictive server 112, data store 140, server machine 170, and server machine 180 can be coupled to each other via a network 130. In some embodiments, network 130 is a public network that provides client device 120 with access to predictive server 112, data store 140, and other publically available computing devices. In some embodiments, network 130 is a private network that provides client device 120 access to manufacturing equipment 124, metrology equipment 128, data store 140, and other privately available computing devices. Network 130 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

It should be noted that in some other implementations, the functions of server machines 170 and 180, as well as predictive server 112, can be provided by a fewer number of machines. For example, in some embodiments, server machines 170 and 180 can be integrated into a single machine, while in some other or similar embodiments, server machines 170 and 180, as well as predictive server 112, can be integrated into a single machine.

In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2:
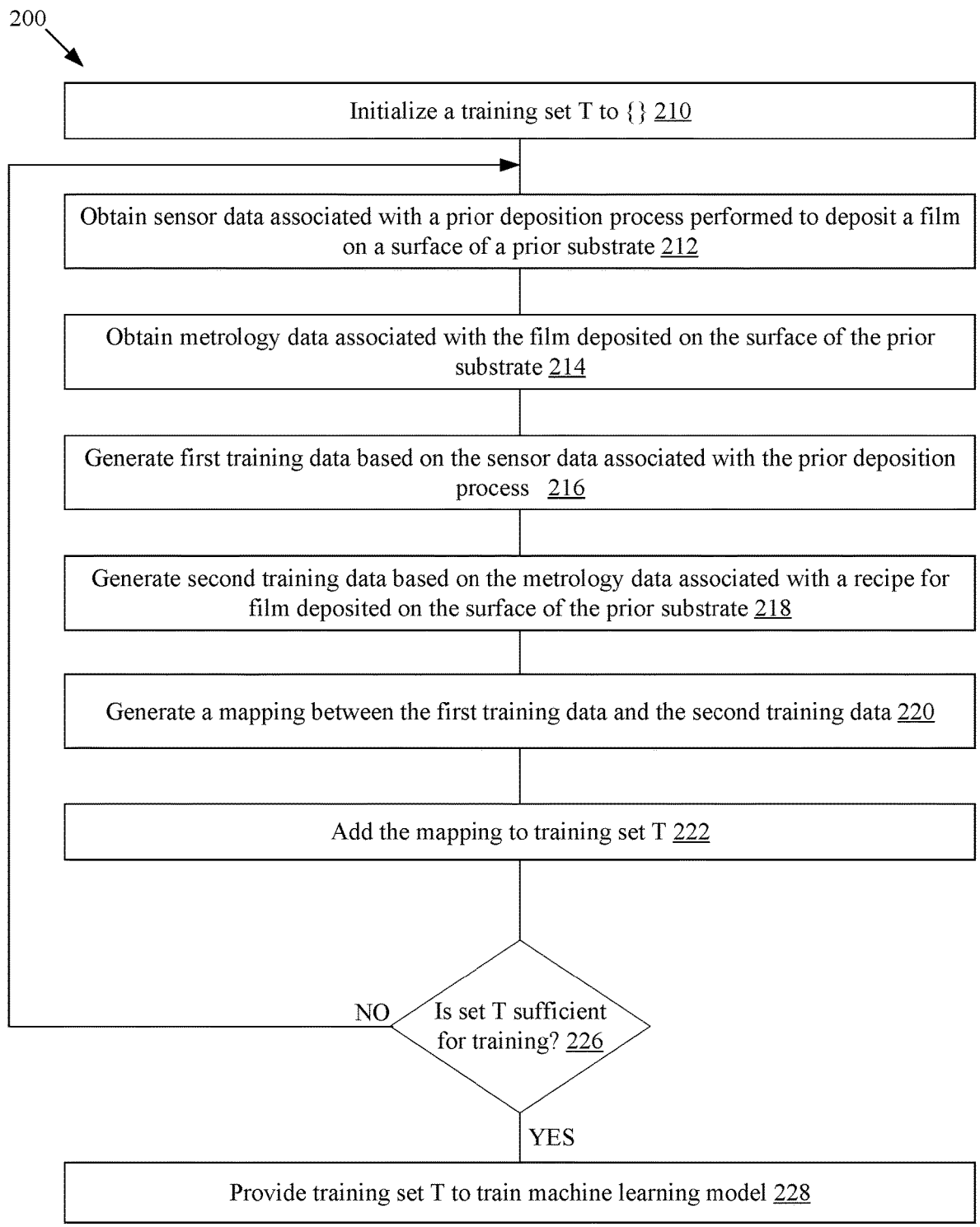
FIG. 2 is a flow diagram of a method for training a machine-learning model, according to certain embodiments.

FIG. 2 is a flow chart of a method 200 for training a machine-learning model, according to aspects of the present disclosure. Method 200 is performed by processing logic that can include hardware (circuitry, dedicated logic, etc.), software (such as is run on a general purpose computer system or a dedicated machine), firmware, or some combination thereof. In one implementation, method 200 can be performed by a computer system, such as computer system architecture 100 of FIG. 1. In other or similar implementations, one or more operations of method 200 can be performed by one or more other machines not depicted in the figures. In some aspects, one or more operations of method 200 can be performed by server machine 170, server machine 180, and/or predictive server 112.

For simplicity of explanation, the methods are depicted and described as a series of acts. However, acts in accordance with this disclosure can occur in various orders and/or concurrently, and with other acts not presented and described herein. Furthermore, not all illustrated acts can be performed to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term article of manufacture, as used herein, is intended to encompass a computer program accessible from any computer-readable device or storage media.

At block 210, processing logic initializes a training set T to an empty set (e.g., { }).

At block 212, processing logic obtains sensor data (e.g., sensor values, features, trace data) associated with a prior deposition process performed to deposit one or more layers of film on a surface of a prior substrate. The sensor data can be further associated with a sub-system of a process chamber. A sub-system can be characterized as a set of sensors related with an operational parameter of the process chamber. An operational parameter can be a temperature, a flow rate, a pressure, and so forth. For example, a pressure sub-system can be characterized by one or more sensors measuring the gas flow, the chamber pressure, the control valve angle, the foreline (vacuum line between pumps) pressure, the pump speed, and so forth. Each process chamber can include multiple different sub-systems, such as a pressure sub-system, a flow sub-system, a temperature sub-system, and so forth.

In some embodiments, the sensor data associated with the deposition process is historical data associated with one or more prior deposition settings for a prior deposition process previously performed for a prior substrate at a manufacturing system. For example, the historical data can be historical contextual data associated with the prior deposition process stored at data store 140. In some embodiments, the one or more prior deposition settings can include at least one of a prior temperature setting for the prior deposition process, a prior pressure setting for the prior deposition setting, a prior flow rate setting for a precursor for one or more material of the prior film deposited on the surface of the prior substrate, or any other setting associated with the deposition process. A flow rate setting can refer to a flow rate setting for the precursor at an initial instance of the prior deposition process (referred to as an initial flow rate setting), a flow rate setting for the precursor at a final instance of the prior deposition process (referred to as a final flow rate setting), or a ramping rate for the flow rate of the precursor during the deposition process. In one example, the precursor for the prior film can include a boron-containing precursor or a silicon-containing precursor. In some embodiments, the sensor data can also be associated with a prior etching process performed on the prior substrate, or any other process performed in the process chamber.

At block 214, processing logic obtains metrology data associated with film deposited on the surface of the prior substrate. The metrology data can include a value of film property data (e.g., wafer spatial film properties), dimensions (e.g., thickness, height, etc.), dielectric constant, dopant concentration, density, defects, etc. The metrology data can be associated with or indicative of manufacturing parameters such as hardware parameters, such as settings or components (e.g., size, type, etc.) of the manufacturing equipment, or process parameters of the manufacturing equipment. In an example, the metrology data can include thickness data (e.g., thickness profile(s)) associated with film deposited on the surface of the prior substrate. The thickness data can be correlated to a certain step associated with a process recipe. Processing logic can obtain the thickness data from data store 140, in accordance with previously described embodiments.

At block 216, processing logic generates first training data based on the obtained sensor data associated with the prior deposition process performed for the prior substrate. At block 218, processing logic generates second training data based on the metrology data associated with the recipe for film deposited on the surface of the prior substrate.

At block 220, processing logic generates a mapping between the first training data and the second training data. The mapping refers to the first training data that includes or is based on data for the prior deposition process performed for the prior substrate and the second training data that includes or is based on thickness data associated with the recipe for film deposited on the surface of the prior substrate, where the first training data is associated with (or mapped to) the second training data. At block 224, processing logic adds the mapping to the training set T.

At block 226, processing logic determines whether the training set, T, includes a sufficient amount of training data to train a machine-learning model. It should be noted that in some implementations, the sufficiency of training set T can be determined based simply on the number of mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set does not include a sufficient amount of training data to train the machine-learning model, method 200 returns to block 212. Responsive to determining the training set T includes a sufficient amount of training data to train the machine-learning model, method 200 continues to block 228.

At block 228, processing logic provides the training set T to train the machine-learning model. In one implementation, the training set T is provided to training engine 182 of server machine 180 to perform the training. In the case of a neural network, for example, input values of a given input/output mapping are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T.

In some embodiments, the processing logic can perform outlier detection methods to remove anomalies from the training set T prior to training the machine-learning model. Outlier detection methods can include techniques that identify values that differ significantly from the majority the training data. These values can be generated from errors, noise, etc.

After block 228, the machine-learning model can be used to generate one or more values indicative of a fault pattern (e.g., abnormal thickness) of the deposited film, generate predicative data indicative of the type of corrective action to perform, and/or perform the corrective action(s) to correct the suspected issue or failure. The predictive data can be generated by comparing the fault pattern to the library of known fault patterns.

Figure 3:
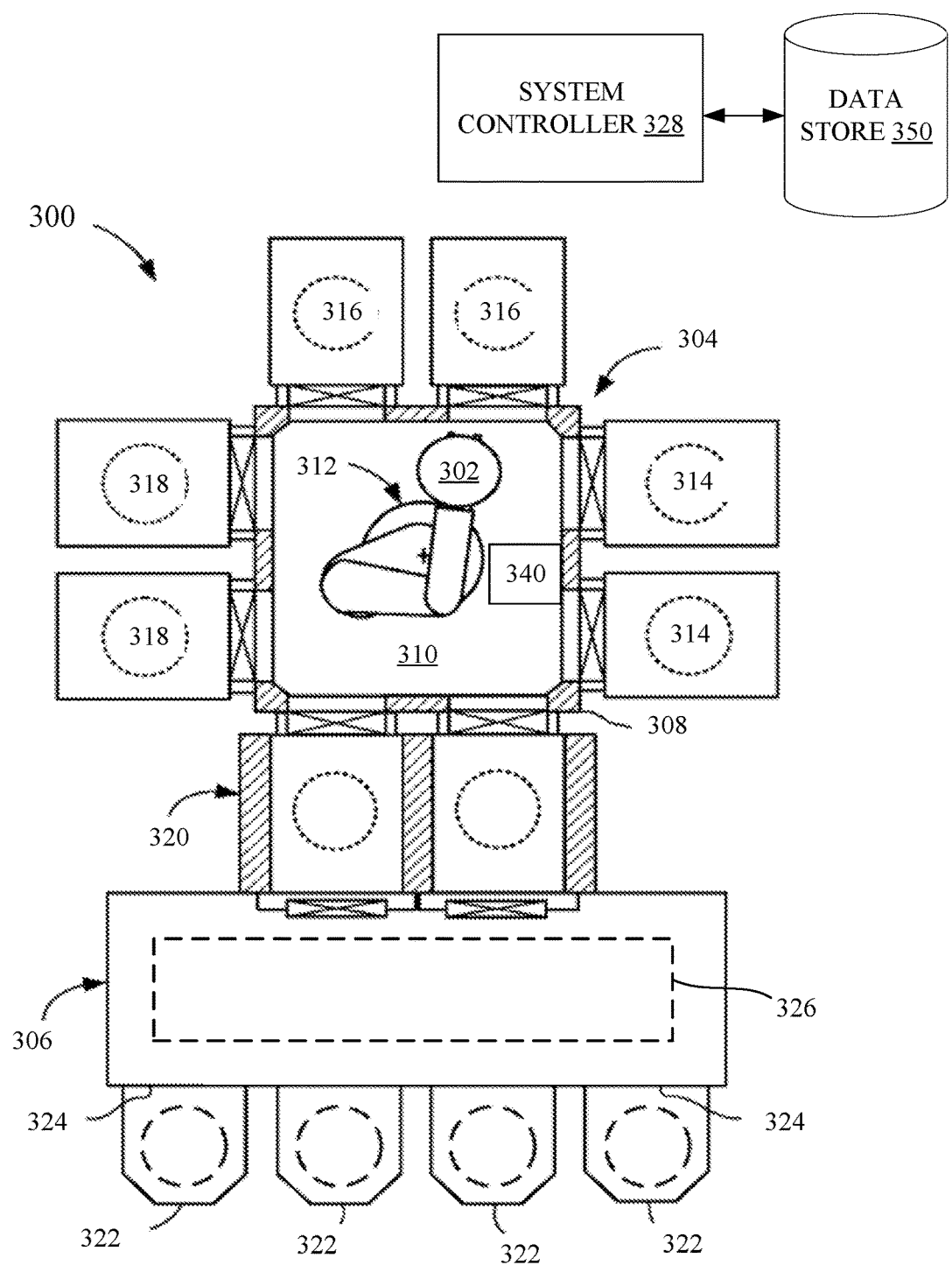
FIG. 3 is a top schematic view of an example manufacturing system, according to certain embodiments.

In some embodiments, a manufacturing system can include more than one process chambers. For example, example manufacturing system 300 of FIG. 3 illustrates multiple process chambers 314, 316, 318. It should be noted that, in some embodiments, data obtained to train the machine-learning model and data collected to be provided as input to the machine-learning model can be associated with the same process chamber of the manufacturing system. In other or similar embodiments, data obtained to train the machine-learning model and data collected to be provided as input to the machine-learning model can be associated with different process chambers of the manufacturing system. In other or similar embodiments, data obtained to train the machine-learning model can be associated with a process chamber of a first manufacturing system and data collected to be provide as input to the machine-learning model can be associated with a process chamber of a second manufacturing system.

FIG. 3 is a top schematic view of an example manufacturing system 300, according to aspects of the present disclosure. Manufacturing system 300 can perform one or more processes on a substrate 302. Substrate 302 can be any suitably rigid, fixed-dimension, planar article, such as, e.g., a silicon-containing disc or wafer, a patterned wafer, a glass plate, or the like, suitable for fabricating electronic devices or circuit components thereon.

Manufacturing system 300 can include a process tool 304 and a factory interface 306 coupled to process tool 304. Process tool 304 can include a housing 308 having a transfer chamber 310 therein. Transfer chamber 310 can include one or more process chambers (also referred to as processing chambers) 314, 316, 318 disposed therearound and coupled thereto. Process chambers 314, 316, 318 can be coupled to transfer chamber 310 through respective ports, such as slit valves or the like. Transfer chamber 310 can also include a transfer chamber robot 312 configured to transfer substrate 302 between process chambers 314, 316, 318, load lock 320, etc. Transfer chamber robot 312 can include one or multiple arms where each arm includes one or more end effectors at the end of each arm. The end effector can be configured to handle particular objects, such as wafers, sensor discs, sensor tools, etc.

Process chambers 314, 316, 318 can be adapted to carry out any number of processes on substrates 302. A same or different substrate process can take place in each processing chamber 314, 316, 318. A substrate process can include atomic layer deposition (ALD), physical vapor deposition (PVD), chemical vapor deposition (CVD), etching, annealing, curing, pre-cleaning, metal or metal oxide removal, or the like. Other processes can be carried out on substrates therein. Process chambers 314, 316, 318 can each include one or more sensors configured to capture data for substrate 302 before, after, or during a substrate process. For example, the one or more sensors can be configured to capture spectral data and/or non-spectral data for a portion of substrate 302 during a substrate process. In other or similar embodiments, the one or more sensors can be configured to capture data associated with the environment within process chamber 314, 316, 318 before, after, or during the substrate process. For example, the one or more sensors can be configured to capture data associated with a temperature, a pressure, a gas concentration, etc. of the environment within process chamber 314, 316, 318 during the substrate process. In some embodiments, process chamber 314, 316, 318 can include metrology equipment 340.

Metrology equipment 340 be similar or the same as metrology equipment 127, 128. In some embodiments, metrology equipment 340 can be located within the process tool, as shown. In other embodiments, metrology equipment 340 can be located within one or more process chambers 314, 316, 318. In some embodiments, the substrate can be placed onto metrology equipment 340 using transfer chamber robot 312. In other embodiments, the metrology equipment 340 can be part of the substrate support assembly (not shown).

A load lock 320 can also be coupled to housing 308 and transfer chamber 310. Load lock 320 can be configured to interface with, and be coupled to, transfer chamber 310 on one side and factory interface 306. Load lock 320 can have an environmentally-controlled atmosphere that can be changed from a vacuum environment (wherein substrates can be transferred to and from transfer chamber 310) to an at or near atmospheric-pressure inert-gas environment (wherein substrates can be transferred to and from factory interface 306) in some embodiments. Factory interface 306 can be any suitable enclosure, such as, e.g., an Equipment Front End Module (EFEM). Factory interface 306 can be configured to receive substrates 302 from substrate carriers 322 (e.g., Front Opening Unified Pods (FOUPs)) docked at various load ports 324 of factory interface 306. A factory interface robot 326 (shown dotted) can be configured to transfer substrates 302 between carriers (also referred to as containers) 322 and load lock 320. Carriers 322 can be a substrate storage carrier or a replacement part storage carrier.

Manufacturing system 300 can also be connected to a client device (not shown) that is configured to provide information regarding manufacturing system 300 to a user (e.g., an operator). In some embodiments, the client device can provide information to a user of manufacturing system 300 via one or more graphical user interfaces (GUIs). For example, the client device can provide information regarding a target thickness profile for a film to be deposited on a surface of a substrate 302 during a deposition process performed at a process chamber 314, 316, 318 via a GUI. The client device can also provide information regarding a modification to a process recipe in view of a respective set of deposition settings predicted to correspond to the target profile, in accordance with embodiments described herein.

Manufacturing system 300 can also include a system controller 328. System controller 328 can be and/or include a computing device such as a personal computer, a server computer, a programmable logic controller (PLC), a microcontroller, and so on. System controller 328 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more specialpurpose processing devices such as an application specific integrated circuit (ASIC), a field programmable gate array (FPGA), a digital signal processor (DSP), network processor, or the like. System controller 328 can include a data storage device (e.g., one or more disk drives and/or solid state drives), a main memory, a static memory, a network interface, and/or other components. System controller 328 can execute instructions to perform any one or more of the methodologies and/or embodiments described herein. In some embodiments, system controller 328 can execute instructions to perform one or more operations at manufacturing system 300 in accordance with a process recipe. The instructions can be stored on a computer readable storage medium, which can include the main memory, static memory, secondary storage and/or processing device (during execution of the instructions).

System controller 328 can receive data from sensors included on or within various portions of manufacturing system 300 (e.g., processing chambers 314, 316, 318, transfer chamber 310, load lock 320, etc.). In some embodiments, data received by the system controller 328 can include spectral data and/or non-spectral data for a portion of substrate 302. In other or similar embodiments, data received by the system controller 328 can include data associated with processing substrate 302 at processing chamber 314, 316, 318, as described previously. For purposes of the present description, system controller 328 is described as receiving data from sensors included within process chambers 314, 316, 318. However, system controller 328 can receive data from any portion of manufacturing system 300 and can use data received from the portion in accordance with embodiments described herein. In an illustrative example, system controller 328 can receive data from one or more sensors for process chamber 314, 316, 318 before, after, or during a substrate process at the process chamber 314, 316, 318. Data received from sensors of the various portions of manufacturing system 300 can be stored in a data store 350. Data store 350 can be included as a component within system controller 328 or can be a separate component from system controller 328. In some embodiments, data store 350 can be data store 140 described with respect to FIG. 1.

Figure 4:
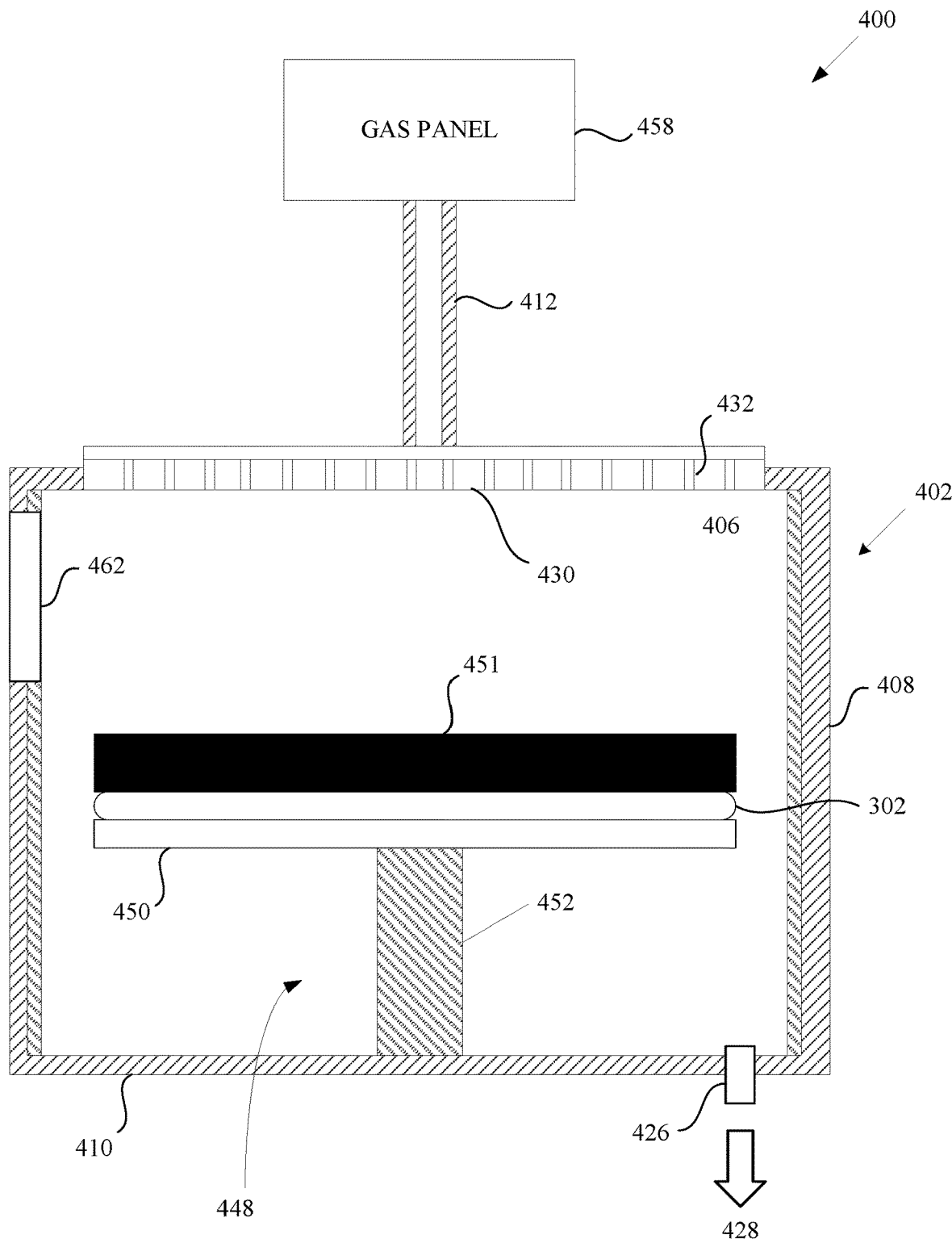
FIG. 4 is a cross-sectional schematic side view of an example process chamber of the example manufacturing system, according to certain embodiments.

FIG. 4 is a cross-sectional schematic side view of a process chamber 400, in accordance with embodiments of the present disclosure. In some embodiments, process chamber 400 can correspond to process chamber 314, 316, 318, described with respect to FIG. 3. Process chamber 400 can be used for processes in which a corrosive plasma environment is provided. For example, the process chamber 400 can be a chamber for a plasma etcher or plasma etch reactor, and so forth. In another example, process chamber can be a chamber for a deposition process, as previously described. In one embodiment, the process chamber 400 includes a chamber body 402 and a showerhead 430 that encloses an interior volume 406. The showerhead 430 can include a showerhead base and a showerhead gas distribution plate. Alternatively, the showerhead 430 can be replaced by a lid and a nozzle in some embodiments, or by multiple pie shaped showerhead compartments and plasma generation units in other embodiments. The chamber body 402 can be fabricated from aluminum, stainless steel or other suitable material such as titanium (Ti). The chamber body 402 generally includes sidewalls 408 and a bottom 410. An exhaust port 426 can be defined in the chamber body 402, and can couple the interior volume 406 to a pump system 428. The pump system 428 can include one or more pumps and throttle valves utilized to evacuate and regulate the pressure of the interior volume 406 of the process chamber 400.

The showerhead 430 can be supported on the sidewall 408 of the chamber body 402. The showerhead 420 (or lid) can be opened to allow access to the interior volume 406 of the process chamber 400, and can provide a seal for the process chamber 400 while closed. A gas panel 458 can be coupled to the process chamber 400 to provide process and/or cleaning gases to the interior volume 406 through the showerhead 430 or lid and nozzle (e.g., through apertures of the showerhead or lid and nozzle). For example. gas panel 458 can provide precursors for materials of a film 451 deposited on a surface of a substrate 302. In some embodiments, a precursor can include a silicon-based precursor or a boron-based precursor. The showerhead 430 can include a gas distribution plate (GDP) and can have multiple gas delivery holes 432 (also referred to as channels) throughout the GDP. A substrate support assembly 448 is disposed in the interior volume 406 of the process chamber 400 below the showerhead 430. The substrate support assembly 448 holds a substrate 302 during processing (e.g., during a deposition process) using, for example, electrostatic chuck 450.

In some embodiments, processing chamber 400 can include metrology equipment (not shown) configured to generate in-situ metrology measurements during a process performed at process chamber 400. The metrology equipment can be operatively coupled to the system controller (e.g., system controller 328, as previously described). In some embodiments, the metrology equipment can be configured to generate a metrology measurement value (e.g., a thickness) for film 451 during particular instances of the deposition process. The system controller can generate a thickness profile for film 451 based on the received metrology measurement values from the metrology equipment. In other or similar embodiments, processing chamber 400 does not include metrology equipment. In such embodiments, the system controller can receive one or more metrology measurement values for film 451 after completion of the deposition process at process chamber 400. System controller can determine a deposition rate based on the one or more metrology measurement values and can associate generate the thickness profile for film 451 based on the determined concentration gradient and the determined deposition rate of the deposition process.

Figure 5:
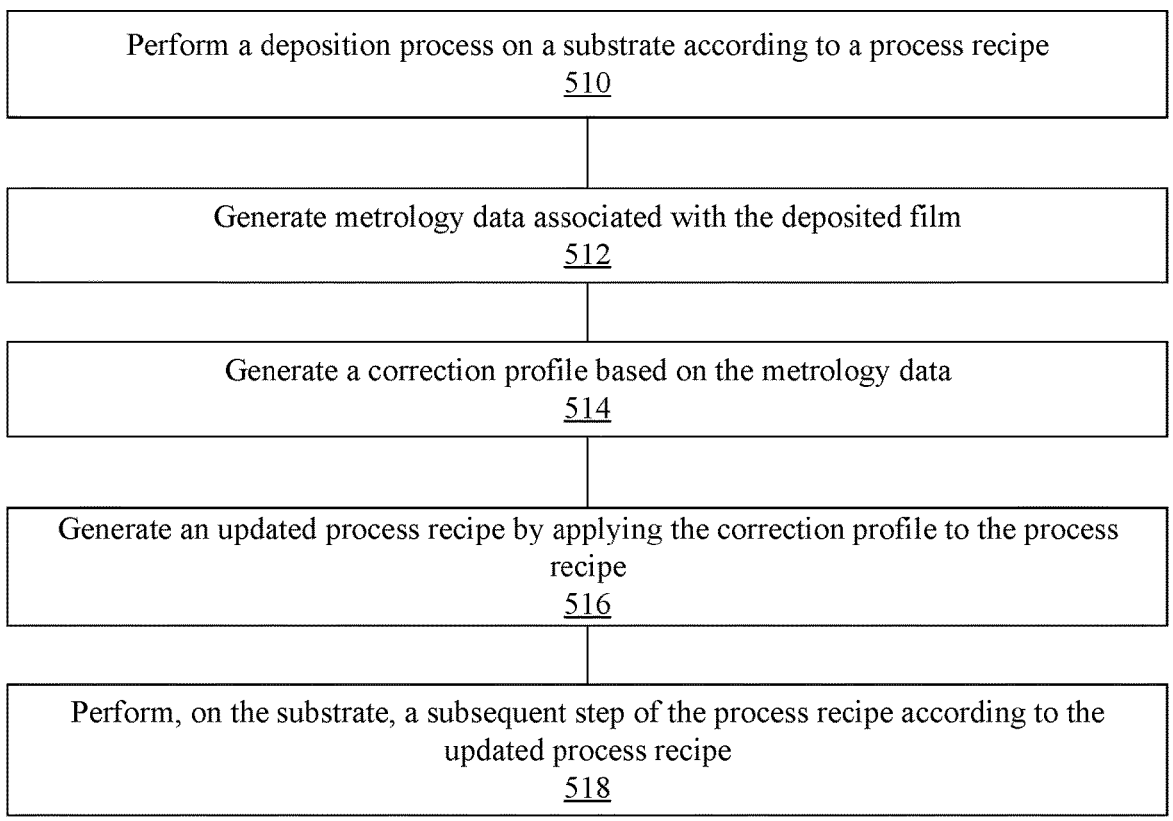
FIG. 5 is a flow diagram of a method for determining a correction profile for a process recipe, according to certain embodiments.

FIG. 5 is a flow chart of a method 500 for determining a correction profile for a process recipe, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by manufacturing equipment 124 and/or client device 122.

At operation 510, the processing logic performs a deposition process on a substrate according to a process recipe. The deposition process can be performed in one or more process chambers. The process recipe can include one or more setting parameters for the deposition process. For example, the setting parameters can include a temperature setting for the process chamber, a pressure setting for the process chamber, a flow rate setting for a precursor for a material included in the film deposited on the substrate surface, a showerhead height, etc. The deposition process can deposit multiple layers on the substrate. For example, the deposition process can deposit alternating layers of oxide and nitride layers, alternating oxide and polysilicon layers, etc.

At operation 512, the processing logic generates metrology data associated with the deposited film. The metrology data can include a value of film property data (e.g., wafer spatial film properties), dimensions (e.g., thickness, height, etc.), dielectric constant, dopant concentration, density, defects, etc. In some embodiments the metrology data can include a thickness profile indicative of the thickness of one or more layers of the film. The thickness profile can include multiple data values indicative of the thickness of the deposited film at different locations on the substrate. In an illustrative example, the thickness profile can include approximately 3,000 data values across the surface of the substrate. In another embodiment, the thickness profile can include data values only along the edge of the substrate, which can be used to generate a correction profile for improving an etching process along the edge of the deposited film. In some embodiments, the metrology data can be generated using in-situ metrology equipment (e.g., metrology equipment 127 or metrology equipment 340) that is located within the process chamber performing the deposition process or within the transfer chamber.

At operation 514, the processing logic generates a correction profile based on the metrology data. The correction profile can include one or more corrective actions to be applied to the parameters of the process recipe or the process chamber. For example, the correction profile can include an adjustment to the temperature setting for the process chamber, the pressure setting for the process chamber, the flow rate setting for a precursor for a material included in the film deposited on the substrate surface, to the power supplied to the process chamber, to the ratio of two or more settings, etc. In some embodiments, the processing logic can generate the correction profile(s) by determining a delta (difference) between an expected profile (e.g., the thickness profile expected to be generated by the process recipe) and the thickness profile generated by the metrology equipment. The processing logic can then generate the correction profile by applying an algorithm to the delta and/or looking up the delta in a library of known faults. For example, the library can include a list of delta correlating to specific correction profiles.

In some embodiments, the correction profile can be generated using a machine-learning model (e.g., model 190). For example, the thickness profile can be input into a trained machine-learning model. The trained machine-learning model can output a value indicative of a difference between the expected thickness profile of the film on the substrate and the actual thickness profile of the film on the substrate. The processing logic can then compare the output to a library of known fault patterns to determine a correction profile. In another example, the machine-learning model can output one or more values indicative of a correction profile.

At operation 516, the processing logic generates an updated process recipe by applying the correction profile to the process recipe. For example, the correction profile can be applied to one or more steps of the current deposition process, to an etch process to be performed on the deposited film, or any other process of the recipe (e.g., polishing process, cleaning process, etc.).

At operation 518, the processing logic performs, on the substrate, a subsequent step of the process recipe according to the updated process recipe. In some embodiments, the subsequent step comprises another deposition step, an etch process, a polish process, a cleaning process, etc. In some embodiments, the update process recipe can be used to perform additional deposition steps on the substrate. For example, the processing logic can deposit a first set of film layers on the substrate, determine the thickness profile of the deposited film, generate a correction profile to correct any faults detected during the deposition of the first set of film layers, apply the correction profile to the process recipe, and deposit a second set of film layers on the substrate. Accordingly, the deposition process recipe can be adjusted in real or near real-time.

In some embodiments, the update process recipe can be used to perform an etch process on the deposited film layers. For example, the processing logic can determine the thickness profile of the deposited film and generate a correction profile based on the difference between the expected thickness and the actual thickness of the film on the substrate. The processing logic can then apply the correction profile to the process recipe to adjust the etch process of the recipe. It should be understood that the etch process does not have to be associated with the same recipe as the deposition process, and can be associated with another recipe. In an illustrative embodiments, the correction profile can perform corrections to the etch process improve etching the edge of the substrate, to improve or eliminate process drifting (e.g., chuck temperature drifting, lid temperature change, coating degradation, etc.) during the etch process, etc.

Figure 6:
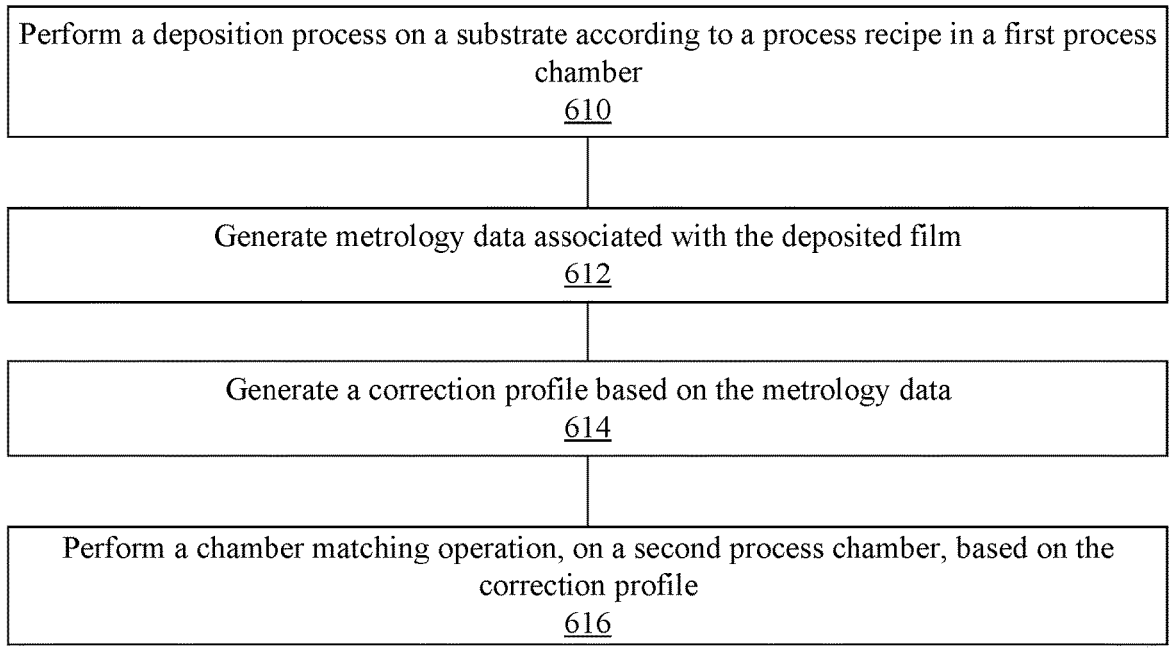
FIG. 6 is a flow diagram of a method for adjusting a process recipe, according to certain embodiments.

FIG. 6 is a flow chart of a method 600 for adjusting a process recipe, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 100 of FIG. 1. In other or similar implementations, one or more operations of method 600 can be performed by one or more other machines not depicted in the figures. In some aspects, one or more operations of method 600 can be performed by manufacturing equipment 124 and/or client device 122.

At operation 610, the processing logic performs a deposition process on a substrate according to a process recipe. The deposition process can be performed in a first process chamber. The process recipe can include one or more setting parameters for the deposition process.

At operation 612, the processing logic generates metrology data associated with the deposited film. The metrology data can include a thickness profile indicative of the thickness of one or more layers of the film. The metrology data can be generated using in-situ metrology equipment (e.g., metrology equipment 127 or metrology equipment 340) that is located within the process chamber performing the deposition process or within the transfer chamber At operation 614, the processing logic generates a correction profile based on the metrology data. The correction profile can include one or more corrective actions to be applied to the parameters of the process recipe or the process chamber. For example, the correction profile can include an adjustment to the temperature setting for the process chamber, the pressure setting for the process chamber, the flow rate setting for a precursor for a material included in the film deposited on the substrate surface, to the power supplied to the process chamber, to the ratio of two or more settings, etc.

At operation 616, the processing logic performs a chamber matching operation, on a second process chamber, based on the correction profile. Chamber matching can be used to minimize process variation between substrates due to hardware variation. For example, the hardware variations can include different chuck temperatures, different lid temperatures, differences in the power delivery to each process chamber, differences in gas flow and/or pressure, etc. The chamber matching operation can include adjusting one or more parameters of the second process chamber or adjusting one or more parameters of a recipe used to generate a substrate in the second process chamber.

Figure 7:
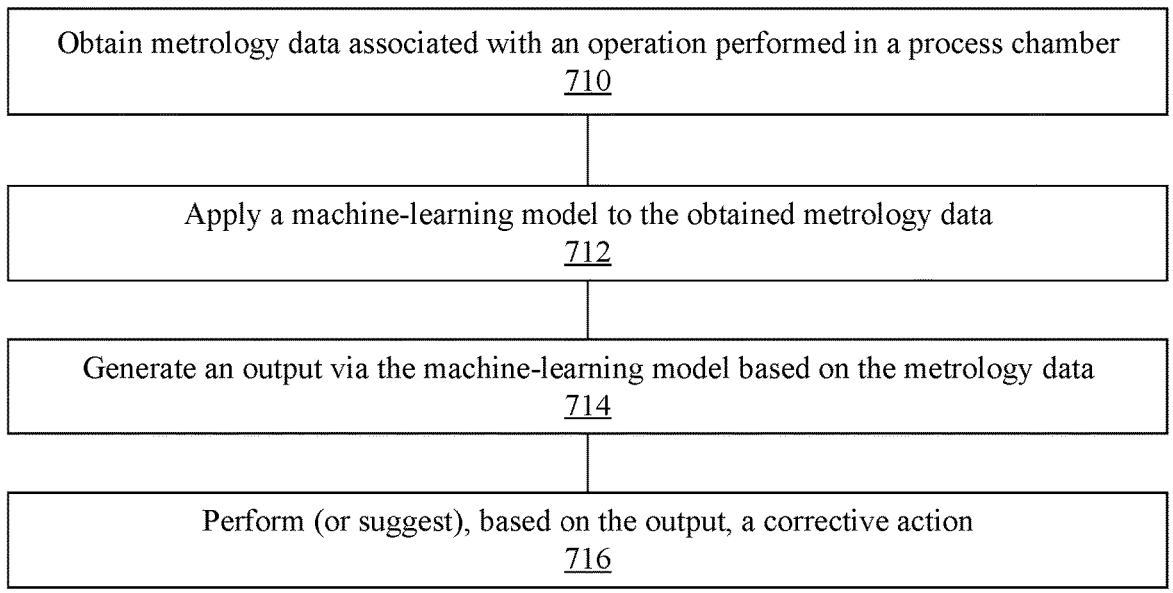
FIG. 7 is a flow diagram of a method for determining a correction profile using a machine-learning model, according to certain embodiments.

FIG. 7 is a flow chart of a method 700 for determining a correction profile using a machine-learning model, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as computer system architecture 100 of FIG. 1. In other or similar implementations, one or more operations of method 700 can be performed by one or more other machines not depicted in the figures. In some aspects, one or more operations of method 700 can be performed by server machine 170, server machine 180, and/or predictive server 112.

At block 710, processing logic obtains metrology data associated with an operation performed in a process chamber. In some embodiments, the operation can include a deposition process performed in a process chamber to deposit one or more layers of film on a surface of a substrate, an etch process performed on the one or more layers of film on the surface of the substrate, etc. The operation can be performed according to a recipe. The metrology data can include a value of film property data (e.g., wafer spatial film properties), dimensions (e.g., thickness, height, etc.), dielectric constant, dopant concentration, density, defects, etc. The metrology data can be associated with or indicative of manufacturing parameters such as hardware parameters, such as settings or components (e.g., size, type, etc.) of the manufacturing equipment, or process parameters of the manufacturing equipment.

At block 712, processing logic applies a machine-learning model (e.g. model 190) to the obtained metrology data. The machine-learning model can be used to generate one or more values a delta between the expected thickness profile of the film on the substrate and the actual thickness profile of the film on the substrate, or one or more values indicative of a correction profile. For example, the machine-learning model can use an algorithm to generate the delta or the correction profile using the training set T.

At block 714, processing logic generates an output via the machine-learning model based on the metrology data. In some embodiments, the output can be a value indicative of a pattern (e.g., a correction profile, a fault pattern). In particular, the output can include predicative data of corrective actions to be applied to a process recipe. In some embodiments, the output can be at least one value indicative of a delta between the expected thickness profile of the film on the substrate and the actual thickness profile of the film on the substrate. In another embodiments, the output can be a corrective profile to an applied to a process recipe.

At block 716, the processing logic can perform (or suggest), based on the output, a corrective action. In some embodiments, the corrective action can be determined based on data obtained from the fault library. In some embodiments, the corrective action can include generating an alert or an indication, to the client device 120, of the determined problem. In some embodiments, the corrective action can include the processing logic adjusting one or more parameters (e.g., a temperature setting for the process chamber, a pressure setting for the process chamber, a flow rate setting for a precursor for a material included in the film deposited on the substrate surface, etc.) of a deposition process recipe, an etch process recipe, or any other process recipe based on a desired property for the film. In some embodiments, the process recipe can be adjusted before, during (e.g., in real time) or after completion of the process recipe.

Figure 8:
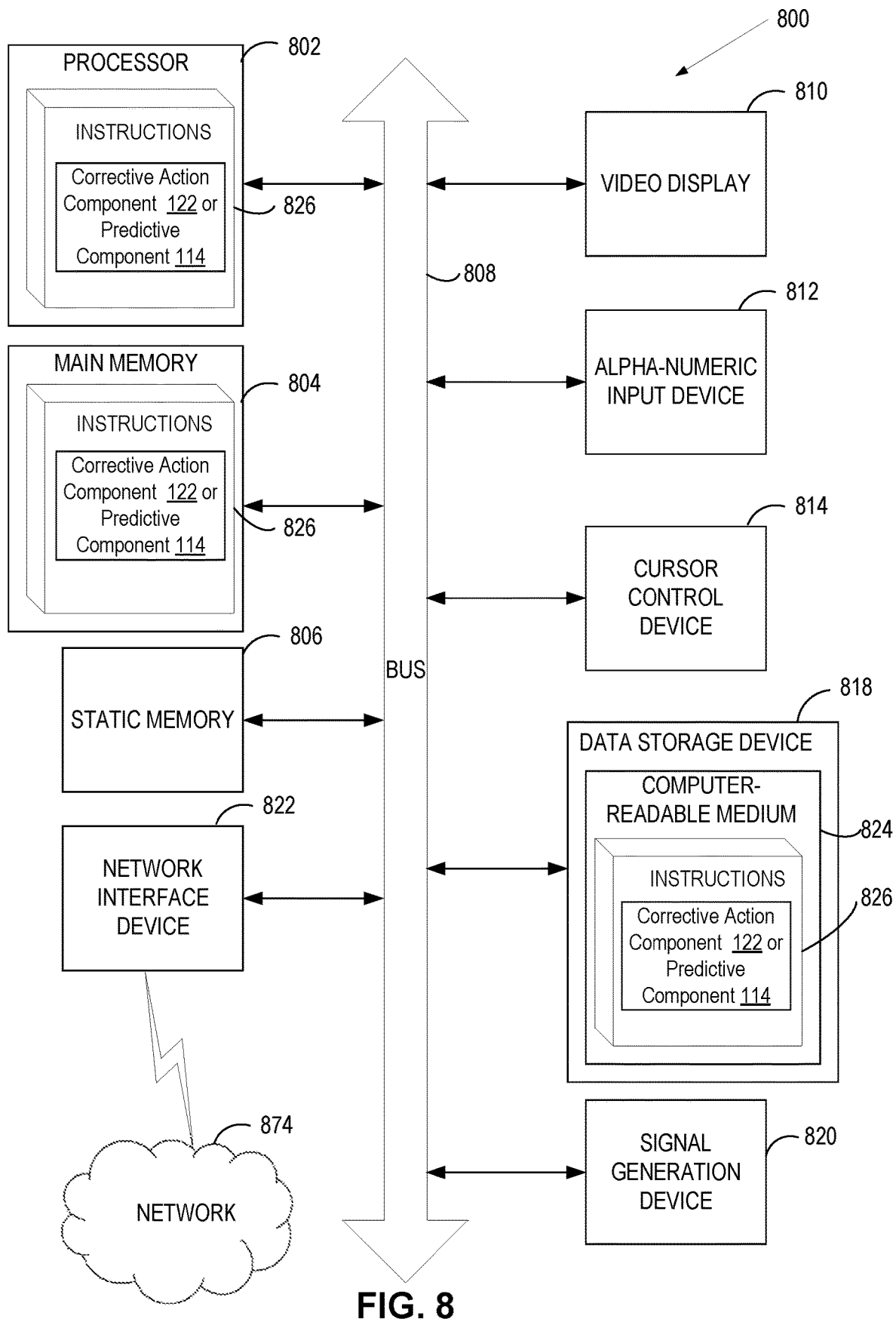
FIG. 8 is a block diagram illustrating a computer system, according to certain embodiments.

FIG. 8 is a block diagram illustrating a computer system 800, according to certain embodiments. In some embodiments, computer system 800 can be connected (e.g., via a network, such as a Local Area Network (LAN), an intranet, an extranet, or the Internet) to other computer systems. Computer system 800 can operate in the capacity of a server or a client computer in a client-server environment, or as a peer computer in a peer-to-peer or distributed network environment. Computer system 800 can be provided by a personal computer (PC), a tablet PC, a Set-Top Box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 800 can include a processing device 802, a volatile memory 804 (e.g., Random Access Memory (RAM)), a non-volatile memory 806 (e.g., Read-Only Memory (ROM) or Electrically-Erasable Programmable ROM (EEPROM)), and a data storage device 816, which can communicate with each other via a bus 808.

Processing device 802 can be provided by one or more processors such as a general purpose processor (such as, for example, a Complex Instruction Set Computing (CISC) microprocessor, a Reduced Instruction Set Computing (RISC) microprocessor, a Very Long Instruction Word (VLIW) microprocessor, a microprocessor implementing other types of instruction sets, or a microprocessor implementing a combination of types of instruction sets) or a specialized processor (such as, for example, an Application Specific Integrated Circuit (ASIC), a Field Programmable Gate Array (FPGA), a Digital Signal Processor (DSP), or a network processor).

Computer system 800 can further include a network interface device 822 (e.g., coupled to network 874). Computer system 800 also can include a video display unit 810 (e.g., an LCD), an alphanumeric input device 812 (e.g., a keyboard), a cursor control device 814 (e.g., a mouse), and a signal generation device 820.

In some implementations, data storage device 816 can include a non-transitory computer-readable storage medium 824 on which can store instructions 826 encoding any one or more of the methods or functions described herein, including instructions encoding components of FIG. 1 (e.g., corrective action component 122, predictive component 114, etc.) and for implementing methods described herein.

Instructions 826 can also reside, completely or partially, within volatile memory 804 and/or within processing device 802 during execution thereof by computer system 800, hence, volatile memory 804 and processing device 802 can also constitute machine-readable storage media.

While computer-readable storage medium 824 is shown in the illustrative examples as a single medium, the term "computer-readable storage medium" shall include a single medium or multiple media (e.g., a centralized or distributed database, and/or associated caches and servers) that store the one or more sets of executable instructions. The term "computer-readable storage medium" shall also include any tangible medium that is capable of storing or encoding a set of instructions for execution by a computer that cause the computer to perform any one or more of the methods described herein. The term "computer-readable storage medium" shall include, but not be limited to, solid-state memories, optical media, and magnetic media.

The methods, components, and features described herein can be implemented by discrete hardware components or can be integrated in the functionality of other hardware components such as ASICS, FPGAs, DSPs or similar devices. In addition, the methods, components, and features can be implemented by firmware modules or functional circuitry within hardware devices. Further, the methods, components, and features can be implemented in any combination of hardware devices and computer program components, or in computer programs.

Unless specifically stated otherwise, terms such as "receiving," "performing," "providing," "obtaining," "causing," "accessing," "determining," "adding," "using," "training," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and can not have an ordinal meaning according to their numerical designation.

Examples described herein also relate to an apparatus for performing the methods described herein. This apparatus can be specially constructed for performing the methods described herein, or it can include a general purpose computer system selectively programmed by a computer program stored in the computer system. Such a computer program can be stored in a computer-readable tangible storage medium.

The methods and illustrative examples described herein are not inherently related to any particular computer or other apparatus. Various general purpose systems can be used in accordance with the teachings described herein, or it can prove convenient to construct more specialized apparatus to perform methods described herein and/or each of their individual functions, routines, subroutines, or operations. Examples of the structure for a variety of these systems are set forth in the description above.

The above description is intended to be illustrative, and not restrictive. Although the present disclosure has been described with references to specific illustrative examples and implementations, it will be recognized that the present disclosure is not limited to the examples and implementations described. The scope of the disclosure should be determined with reference to the following claims, along with the full scope of equivalents to which the claims are entitled.

What is claimed is:

1. A method, comprising:
    performing a deposition process on a substrate according to a plurality of steps of a process recipe, wherein the process recipe comprises a plurality of setting parameters, wherein each step of the plurality of steps comprises depositing one or more film layers on the substrate;
    obtaining, using metrology equipment located within a process chamber performing the deposition process, a respective set of metrology data for each corresponding step of the plurality of steps, wherein the metrology data obtained by the metrology equipment comprises dimension data associated with one or more corresponding film layers of a plurality of film layers deposited on a surface of the substrate;
    generating a correction profile based on the set of metrology data;
    generating an updated process recipe by applying the correction profile to the process recipe; and
    causing an etch process to be performed on the substrate according to the updated process recipe.

2. The method of claim 1, wherein the metrology data is indicative of one or more thickness of the film layers.

3. The method of claim 1, wherein the correction profile comprises one or more corrective actions to be applied to the plurality of setting parameters of the process recipe.

4. The method of claim 1, wherein generating the correction profile comprises:
    determining a delta between an expected thickness profile associated with the process recipe and a thickness profile generated by the metrology equipment; and
    applying an algorithm to the delta.

5. The method of claim 1, wherein generating the correction profile comprises:
    determining a delta between an expected thickness profile associated with the process recipe and a thickness profile generated by the metrology equipment; and
    performing a look up of the delta in a library of known faults, wherein the library comprises a list of delta values correlating to specific correction profiles.

6. The method of claim 1, wherein generating the correction profile comprises:
    inputting the metrology data into a trained machine-learning model;
    obtaining an output value of the trained machine-learning model, the output value being indicative of a delta between an expected thickness profile of the film on the substrate and an actual thickness profile of the film on the substrate; and
    performing a look up of the delta in a library of known faults, wherein the library comprises a list of delta values correlating to specific correction profiles.

7. The method of claim 1, wherein generating the correction profile comprises:
    inputting the metrology data into a trained machine-learning model; and
    obtaining an output value of the trained machine-learning model, the output value being indicative of a correction profile.

8. The method of claim 1, further comprising:
    causing a chamber matching operation to be performed, on another process chamber, based on the correction profile.

9. The method of claim 1, wherein the metrology equipment comprises an infra-red camera.

10. An electronic device manufacturing system, comprising:
    a transfer chamber;
    a process chamber coupled to the transfer chamber; and metrology equipment situated within and coupled to the process chamber, wherein the manufacturing system is configured to:
  perform a deposition process on a substrate according to a plurality of steps of a process recipe, wherein the process recipe comprises a plurality of setting parameters, wherein each step of the plurality of steps comprises depositing one or more film layers on the substrate:
  obtain, using the metrology equipment, a respective set of metrology data for each corresponding step of the plurality of steps, wherein the metrology data obtained by the metrology equipment comprises dimension data associated with one or more corresponding film layers of a plurality of film layers deposited on a surface of the substrate;
  generate a correction profile based on the set of metrology data;
  generate an updated process recipe by applying the correction profile to the process recipe; and
  cause an etch process to be performed on the substrate according to the updated process recipe.

11. The electronic device manufacturing system of claim 10, wherein the metrology data is indicative of one or more thickness of the film layers.

12. The electronic device manufacturing system of claim 10, wherein the correction profile comprises one or more corrective actions to be applied to the plurality of setting parameters of the process recipe.

13. The electronic device manufacturing system of claim 10, wherein generating the correction profile comprises:
  determining a delta between an expected thickness profile associated with the process recipe and a thickness profile generated by the metrology equipment; and
  applying an algorithm to the delta.

14. The electronic device manufacturing system of claim 10, wherein generating the correction profile comprises:
  determining a delta between an expected thickness profile associated with the process recipe and a thickness profile generated by the metrology equipment; and
  performing a look up of the delta in a library of known faults, wherein the library comprises a list of delta values correlating to specific correction profiles.

15. The electronic device manufacturing system of claim 10, wherein generating the correction profile comprises:
  inputting the metrology data into a trained machine-learning model;
  obtaining an output value of the trained machine-learning model, the output value being indicative of a delta between an expected thickness profile of the film on the substrate and an actual thickness profile of the film on the substrate; and
  performing a look up of the delta in a library of known faults, wherein the library comprises a list of delta values correlating to specific correction profiles.

16. The electronic device manufacturing system of claim 10, wherein generating the correction profile comprises:
  inputting the metrology data into a trained machine-learning model; and
  obtaining an output value of the trained machine-learning model, the output value being indicative of a correction profile.

17. The electronic device manufacturing system of claim 10, wherein the manufacturing system is further configured to:
  performing a chamber matching operation, on another process chamber, based on the correction profile.

18. A non-transitory computer-readable storage medium comprising instructions that, when executed by a processing device operatively coupled to a memory, performs operations comprising:
  performing a deposition process on a substrate according to a plurality of steps of a process recipe wherein the process recipe comprises a plurality of setting parameters, wherein each step of the plurality of steps comprises depositing one or more film layers on the substrate;
  obtain, using metrology equipment located within a process chamber performing the deposition process, a respective set of metrology data for each corresponding step of the plurality of steps, wherein the metrology data obtained by the metrology equipment comprises dimension data associated with one or more corresponding film layers of a plurality of film layers deposited on a surface of the substrate;
  generating a correction profile based on the set of metrology data;
  generating an updated process recipe by applying the correction profile to the process recipe; and
  causing an etch process to be performed on the substrate according to the updated process recipe.

19. The non-transitory computer-readable storage medium of claim 18, wherein generating the correction profile comprises:
  determining a delta between an expected thickness profile associated with the process recipe and a thickness profile generated by the metrology equipment; and
  applying an algorithm to the delta.

20. The non-transitory computer-readable storage medium of claim 18, wherein generating the correction profile comprises:
  determining a delta between an expected thickness profile associated with the process recipe and a thickness profile generated by the metrology equipment; and
  performing a look up of the delta in a library of known faults, wherein the library comprises a list of delta values correlating to specific correction profiles.

21. The non-transitory computer-readable storage medium of claim 18, wherein generating the correction profile comprises:
  inputting the metrology data into a trained machine-learning model;
  obtaining an output value of the trained machine-learning model, the output value being indicative of a delta between an expected thickness profile of the film on the substrate and an actual thickness profile of the film on the substrate; and
  performing a look up of the delta in a library of known faults, wherein the library comprises a list of delta values correlating to specific correction profiles.

22. The non-transitory computer-readable storage medium of claim 18, wherein generating the correction profile comprises:
  inputting the metrology data into a trained machine-learning model; and
  obtaining an output value of the trained machine-learning model, the output value being indicative of a correction profile.

23. The non-transitory computer-readable storage medium of claim 18, wherein the processing device is further configured to:

causing a chamber matching operation to be performed, on another process chamber, based on the correction profile.

\* \* \* \* \*